US010615064B2

(12) United States Patent
Ahn et al.

(10) Patent No.: US 10,615,064 B2
(45) Date of Patent: Apr. 7, 2020

(54) TRANSFER HEAD FOR MICRO LED

(71) Applicant: POINT ENGINEERING CO., LTD., Asan (KR)

(72) Inventors: Bum Mo Ahn, Suwon (KR); Seung Ho Park, Hwaseong (KR)

(73) Assignee: POINT ENGINEERING CO., LTD., Asan (KR)

( * ) Notice: Subject to any disclaimer, the term of this patent is extended or adjusted under 35 U.S.C. 154(b) by 0 days.

(21) Appl. No.: 16/366,914

(22) Filed: Mar. 27, 2019

(65) Prior Publication Data
US 2019/0304817 A1 Oct. 3, 2019

(30) Foreign Application Priority Data
Mar. 29, 2018 (KR) .................. 10-2018-0036862

(51) Int. Cl.
| *H01L 21/67* | (2006.01) |
| *B25J 15/06* | (2006.01) |
| *B65G 47/91* | (2006.01) |
| *H01L 33/62* | (2010.01) |
| *H01L 25/075* | (2006.01) |
| *H01L 27/12* | (2006.01) |

(52) U.S. Cl.
CPC .... *H01L 21/67144* (2013.01); *B25J 15/0616* (2013.01); *B65G 47/91* (2013.01); *H01L 25/0753* (2013.01); *H01L 27/1214* (2013.01); *H01L 33/62* (2013.01)

(58) Field of Classification Search
CPC ............... B25J 15/0033; B25J 15/0085; B25J 15/0616; B25J 15/0683; B25J 15/0691; B25J 7/00; B65G 47/91; B65G 47/92; H01L 21/67144; H01L 21/6833; H01L 21/6838
USPC .................................... 294/188, 87.1
See application file for complete search history.

(56) References Cited

U.S. PATENT DOCUMENTS

| 4,557,514 A * | 12/1985 | Cushman | ............... B65G 47/91 248/362 |
| 5,749,614 A * | 5/1998 | Reid | ...................... B65G 47/91 414/627 |
| 6,510,977 B1 * | 1/2003 | Hertz | ................... B23K 3/0623 228/180.22 |
| 7,810,772 B2 * | 10/2010 | Sato | ..................... H01L 21/4853 248/206.5 |
| 9,308,650 B2 * | 4/2016 | Eisele | .................. B25J 15/0071 |
| 9,359,195 B2 * | 6/2016 | Mardilovich | ....... B81C 1/00031 |

(Continued)

FOREIGN PATENT DOCUMENTS

| KR | 100731673 B1 | 6/2007 |
| KR | 20140112486 A | 9/2014 |

(Continued)

*Primary Examiner* — Dean J Kramer

(57) ABSTRACT

The present invention relates to a transfer head for a micro LED, the transfer head gripping a micro LED and transferring the micro LED to a display substrate. In particular, the present invention relates to a transfer head for a micro LED, the transfer head gripping a micro LED in a state where a grip surface of the transfer head and an upper surface of the micro LED are not in contact with each other when transferring the micro LED. Accordingly, it is possible to prevent positional error which may occur when transferring the micro LED and prevent damage of the micro LED.

4 Claims, 11 Drawing Sheets

(56) References Cited

U.S. PATENT DOCUMENTS 9,573,280 B2\* 2/2017 Harter .................... B65G 47/91
2017/0167025 A1\* 6/2017 Ahn .................. C23C 16/45565

FOREIGN PATENT DOCUMENTS

| KR | 20170019415 A | 2/2017 |
| KR | 20170024906 A | 3/2017 |
| KR | 20170026959 A | 3/2017 |
| KR | 101754528 B1 | 7/2017 |
| KR | 101757404 B1 | 7/2017 |

\* cited by examiner

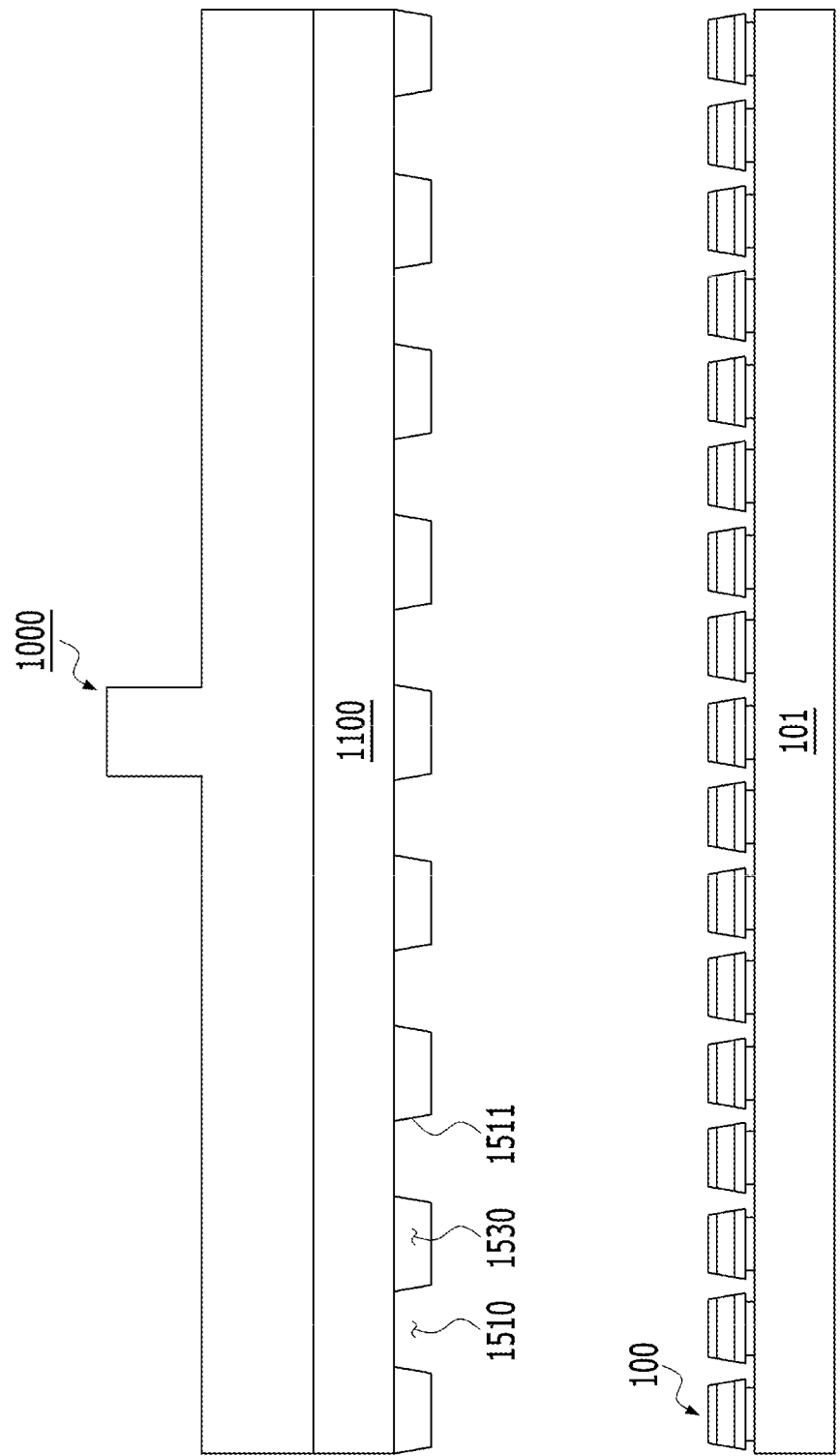

TRANSFER HEAD FOR MICRO LED

CROSS REFERENCE TO RELATED APPLICATION

The present application claims priority to Korean Patent Application No. 10-2018-0036862, filed Mar. 29, 2018, the entire contents of which is incorporated herein for all purposes by this reference.

BACKGROUND OF THE INVENTION

Field of the Invention

The present invention relates to a transfer head for a micro light-emitting diode (micro LED), which is configured to grip a micro LED and transfer the micro LED to a display substrate.

Description of the Related Art

Currently, the display market is still dominated by LCDs, but OLEDs are quickly replacing LCDs and emerging as mainstream products. In a current situation where display makers are rushing to participate in the OLED market, micro light-emitting diode (hereinafter, referred to as micro LED) displays have emerged as another next generation display. Liquid crystal and organic materials are the core materials of LCDs and OLEDs, respectively, whereas the micro LED display uses 1 μm to 100 μm of an LED chip itself as light emitting material.

Since the term "micro LED" emerged in a patent "MICRO-LED ARRAYS WITH ENHANCED LIGHT EXTRACTION" in 1999 (Korean Patent No. 10-0731673, hereinafter referred to as 'Related Art 1') disclosed by Cree Inc., related research papers based thereon were subsequently published. In order to apply the micro LED to a display, it is necessary to develop a customized microchip based on a flexible material and/or flexible device using a micro LED device, and techniques of transferring the micrometer-sized LED chip and mounting the LED chip on a display pixel electrode are required.

Particularly, with regard to the transfer of the micro LED device to the display substrate, as the LED size is reduced to 1 μm to 100 μm, it is impossible to use a conventional pick-and-place machine, and a technology of a transfer head for higher precision is required. With respect to such a technology of a transfer head, several structures have been proposed as described below, but each of the proposed techniques has some problems.

Luxvue Technology Corp., USA, proposed a method of transferring a micro LED using an electrostatic head (Korean Patent Application Publication No. 10-2014-0112486, hereinafter referred to as 'Related Art 2'). A transfer principle of the Related Art 2 is that a voltage is applied to a head portion made of a silicone material so that the head portion comes into close contact with a micro LED due to electrification. However, this method may cause damage to micro LEDs due to electrification caused by the voltage applied to the head portion during induction of static electricity.

X-Celeprint Limited, USA, proposed a method of using an elastic polymer material as a transfer head and transferring a micro LED positioned to a wafer to a desired substrate (Korean Patent Application Publication No. 10-2017-0019415, hereinafter referred to as 'Related Art 3'). According to the Related Art 3, there is no problem in LED damage as compared with the above-mentioned electrostatic head case. An adhesive force of the elastic transfer head is required to be higher than that of a target substrate in the transfer process to transfer a micro LED stably, and an additional process for forming an electrode is required. In addition, maintaining an adhesive force of the elastic polymer material is an important factor.

Korea Photonics Technology Institute proposed a method of transferring a micro LED using a ciliary adhesive-structured head (Korean Patent No. 10-1754528, hereinafter referred to as 'Related Art 4'). However, in the Related Art 4, it is difficult to manufacture a ciliary adhesive structure.

Korea Institute of Machinery and Materials has proposed a method of transferring a micro LED using a roller coated with an adhesive (Korean Patent No. 10-1757404, hereinafter referred to as 'Related Art 5'). However, the Related Art 5 has a problem in that continuous use of the adhesive is required, and the micro LED may be damaged when pressed with the roller.

Samsung Display Co., Ltd proposed a method of transferring a micro-LED to an array substrate according to electrostatic induction by applying a negative voltage to first and second electrodes of the array substrate in a state where the array substrate is immersed in a solution (Korean Patent Application Publication No. 10-2017-0026959, hereinafter referred to as 'Related Art 6'). However, the Related Art 6 has a problem in that a solution is required since the micro LED is immersed in the solution to transfer to the array substrate, and a drying process is required.

LG Electronics Inc. proposed a method in which a head holder is disposed between multiple pick-up heads and a substrate and a shape of the head holder is deformed by movement of the multiple pick-up heads such that the multiple pick-up heads are allowed to move freely (Korean Patent Application Publication No. 10-2017-0024906, hereinafter referred to as 'Related Art 7'). However, the Related Art 7 has a problem in that a process of applying a bonding material to the pick-up heads is required because the bonding material having an adhesive force is required to be applied to bonding surfaces of the multiple pick-up heads to transfer the micro LED.

In addition to the problems of the above-described related arts, the related arts have a problem in that, when transferring the micro LED from a growth substrate to a display substrate, a grip surface of a transfer head comes into contact with an upper surface of the micro LED.

In detail, the grip surface of the transfer head comes into direct contact with the micro LED during lowering of the transfer head, a position of the micro LED formed on the growth substrate is mislaid, and a positional error may occur in the display substrate when mounted on the display substrate. Furthermore, since the micro LED has a very small size, the micro LED may be damaged when coming into contact with the grip surface of the transfer head.

In order to solve the problems of the related arts described above, it is necessary to solve the above-mentioned problems while adopting the basic principles adopted in the related arts. However, there is a limit to solving the problems because such problems are derived from the basic principles adopted in the related arts. Therefore, applicants of the present invention have not only solved the problems of the related arts but also proposed an advanced method which has not been considered in the related arts.

Documents of Related Art (Patent Document 1) Korean Patent No. 10-0731673;
(Patent Document 2) Korean Patent Application Publication No. 10-2014-0112486;
(Patent Document 3) Korean Patent Application Publication No. 10-2017-0019415;

(Patent Document 4) Korean Patent No. 10-1754528;
(Patent Document 5) Korean Patent No. 10-1757404;
(Patent Document 6) Korean Patent Application Publication No. 10-2017-0026959; and
(Patent Document 7) Korean Patent Application Publication No. 10-2017-0024906

SUMMARY OF THE INVENTION

Accordingly, the present invention has been made keeping in mind the above problems occurring in the related art, and the present invention is intended to propose a transfer head for a micro LED, the transfer head gripping a micro LED in a state where a grip surface of the transfer head and an upper surface of the micro LED are not in contact with each other when transferring the micro LED such that it is possible to prevent positional error which may occur when transferring the micro LED and to prevent damage to the micro LED.

In order to achieve the above objective, there is provided a transfer head according to the present invention, the transfer head having a recess portion at a lower portion thereof. A micro LED is picked up by the recess portion.

In addition, the recess portion may pick up the micro LED by at least one of an electrostatic force, a magnetic force, and a suction force.

In addition, when the transfer head picks up the micro LED, the transfer head may be controlled such that a lower surface thereof is spaced apart from an upper surface of the micro LED.

In addition, the recess portion may have an inclined portion.

In addition, only one micro LED may be picked up by the recess portion.

Furthermore, the transfer head may be provided with a porous member. The recess portion may be configured on a lower surface of the porous member, and the porous member may be an anodic oxide film.

As described above, a transfer head for a micro LED according to the present invention has the following effects.

When picking up a micro LED, a transfer head grips the micro LED in a state where a lower surface of the transfer head is spaced apart from an upper surface of the micro LED by a predetermined distance. Therefore, it is possible to prevent distortion which may occur by contact between the lower surface of the transfer head and the upper surface of the micro LED and prevent positional error which may occur when transferring the micro LED to a display substrate.

Since the lower surface of the transfer head is not brought into contact with the upper surface of the micro LED, it is possible to prevent the micro LED from being damaged by the lower surface of the transfer head.

When a micro LED is picked up from a growth substrate and inserted into a recess portion, an inclined portion guides the micro LED such that the micro LED is sucked at a correct position and picked up. Therefore, it is possible to transfer the micro LED to a display substrate at the correct position.

When forming an anodic oxide film, pores are uniformly formed such that a suction force or vacuum is uniformly transferred, whereby it is possible to easily grip a micro LED having a small size.

BRIEF DESCRIPTION OF THE DRAWINGS

The above and other objects, features and other advantages of the present invention will be more clearly understood from the following detailed description when taken in conjunction with the accompanying drawings, in which:

FIGS. 5A to 5D are views illustrating a method of transferring micro LEDs using the transfer head for a micro LED illustrated in FIG. 3;

DETAILED DESCRIPTION OF THE INVENTION

Figure 1:
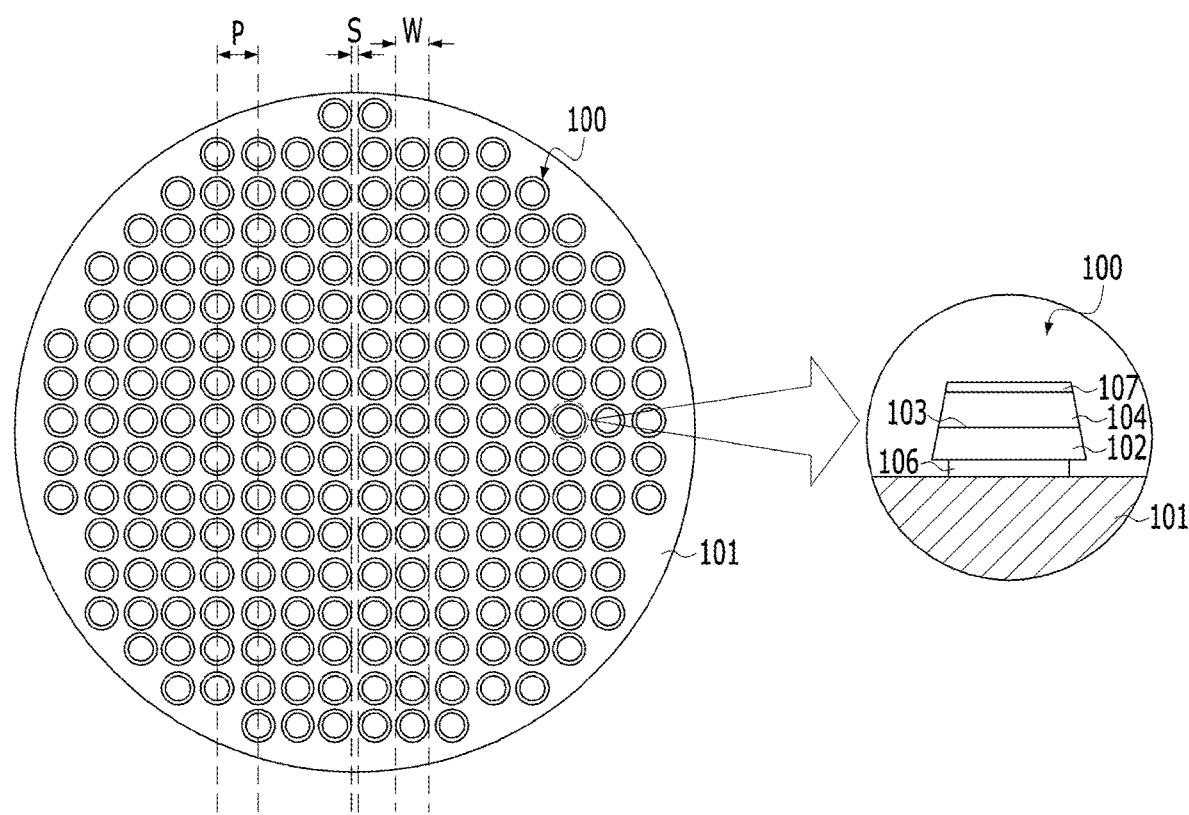
FIG. 1 is a view illustrating a micro LED, which is an object to be transferred according to an embodiment of the present invention.

Contents of the description below merely exemplify the principle of the invention. Therefore, those of ordinary skill in the art may implement the theory of the invention and invent various apparatuses which are included within the concept and the scope of the invention even though it is not clearly explained or illustrated in the description. Furthermore, in principle, all the conditional terms and embodiments listed in this description are clearly intended for the purpose of understanding the concept of the invention, and one should understand that this invention is not limited to the exemplary embodiments and the conditions.

The above described objectives, features, and advantages will be more apparent through the following detailed description related to the accompanying drawings, and thus those of ordinary skill in the art may easily implement the technical spirit of the invention.

The embodiments of the present invention are described with reference to cross-sectional views and/or perspective views which schematically illustrate ideal embodiments of the present invention. For explicit and convenient description of the technical content, sizes or thicknesses of films and regions and diameters of holes in the figures may be exaggerated. Therefore, variations from the shapes of the illustrations as a result, for example, of manufacturing techniques and/or tolerances, are to be expected. In addition, a limited number of multiple micro LEDs are illustrated in the drawings. Thus, the embodiments should not be construed as limited to the particular shapes of regions illustrated herein but are to include deviations in shapes that result, for example, from manufacturing.

Wherever possible, the same reference numerals will be used throughout different embodiments and the description to refer to the same or like elements or parts. In addition, the configuration and operation already described in other embodiments will be omitted for convenience.

Hereinafter, embodiments of the present invention will be described in detail with reference to the accompanying drawings.

FIG. 1 is a view illustrating a micro light-emitting diode (micro LED) which is an object to be transferred according to an embodiment of the present invention.

A micro LED 100 is fabricated and disposed on a growth substrate 101.

The growth substrate 101 may be formed into a conductive substrate or an insulating substrate. For example, the growth substrate 101 is formed of at least one selected from among the group consisting of sapphire, SiC, Si, GaAs, GaN, ZnO, GaP, InP, Ge, and $Ga_2O_3$.

Each of the micro LEDs 100 includes: a first semiconductor layer 102; a second semiconductor layer 104; an active layer 103 provided between the first semiconductor layer 102 and the second semiconductor layer 104; a first contact electrode 106; and a second contact electrode 107.

The first semiconductor layer 102, the active layer 103, and the second semiconductor layer 104 may be formed by performing metalorganic chemical vapor deposition (MOCVD), chemical vapor deposition (CVD), plasma-enhanced chemical vapor deposition (PECVD), molecular-beam epitaxy (MBE), hydride vapor phase epitaxy (HVPE), or the like.

The first semiconductor layer 102 may be implemented, for example, as a p-type semiconductor layer. A p-type semiconductor layer may be a semiconductor material having a composition formula of $In_xAl_yGa_{1-x-y}N$ ($0 \leq x \leq 1$, $0 \leq y \leq 1$, $0 \leq x+y \leq 1$), for example, GaN, AlN, AlGaN, InGaN, InN, InAlGaN, AlInN, and the like, and the layer may be doped with a p-type dopant such as Mg, Zn, Ca, Sr, and Ba.

The second semiconductor layer 104 may be implemented, for example, as an n-type semiconductor layer. An n-type semiconductor layer may be a semiconductor material having a composition formula of $In_xAl_yGa_{1-x-y}N$ ($0 \leq x \leq 1$, $0 \leq y \leq 1$, $0 \leq x+y \leq 1$), for example, GaN, AlN, AlGaN, InGaN, InNInAlGaN, AlInN, and the like, and the layer may be doped with an n-type dopant such as Si, Ge, and Sn.

However, the present invention is not limited to this. The first semiconductor layer 102 may include an n-type semiconductor layer, and the second semiconductor layer 104 may include a p-type semiconductor layer.

The active layer 103 is a region where electrons and holes are recombined. As the electrons and the holes are recombined, the active layer 103 transits to a low energy level and generates light having a wavelength corresponding thereto. The active layer 103 may be formed of a semiconductor material having a composition formula of $In_xAl_yGa_{1-x-y}N$ ($0 \leq x \leq 1$, $0 \leq y \leq 1$, $0 \leq x+y \leq 1$) and may have a single quantum well structure or a multi quantum well (MQW) structure. In addition, the active layer 103 may have a quantum wire structure or a quantum dot structure.

The first semiconductor layer 102 may be provided with the first contact electrode 106, and the second semiconductor layer 104 may be provided with the second contact electrode 107. The first contact electrode 106 and/or the second contact electrode 107 may include one or more layers and may be formed of various conductive materials including a metal, conductive oxide, and conductive polymer.

The multiple micro LEDs 100 formed on the growth substrate 101 are separated into individual pieces by cutting along a cutting line using a laser or the like or by etching. Then, it is possible to separate the individual micro LEDs 100 from the growth substrate 101 by a laser lift-off process.

In FIG. 1, the letter 'P' denotes a pitch distance between the micro LEDs 100, 'S' denotes a separation distance between the micro LEDs 100, and 'W' denotes a width of each micro LED 100.

Figure 2:
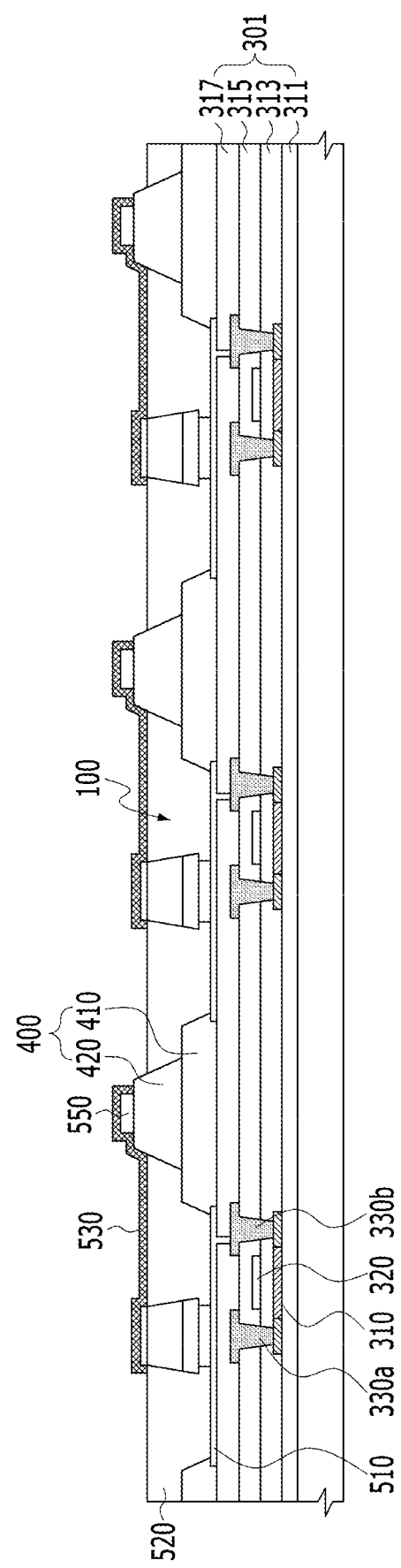
FIG. 2 is a view of a micro LED structure transferred to a display substrate and mounted according to an embodiment of the present invention.

FIG. 2 is a view of a micro LED structure transferred to a display substrate and mounted according to an embodiment of the present invention.

A display substrate 301 may include various materials. For example, the display substrate 301 may be made of a transparent glass material having $SiO_2$ as a main component. However, materials of the display substrate 301 are not limited to this, and the display substrate 301 may be made of a transparent plastic material and thus have solubility. The plastic material may be an organic insulating substance selected from the group consisting of polyethersulfone (PES), polyacrylate (PAR), polyetherimide (PEI), polyethylene naphthalate (PEN), polyethylene terephthalate (PET), polyphenylene sulfide (PPS), Polyarylate, polyimide, polycarbonate (PC), cellulose triacetate (TAC), and cellulose acetate propionate (CAP).

In the case of a bottom emission type in which an image is implemented in a direction of the display substrate 301, the display substrate 301 is required to be formed of a transparent material. However, in the case of a top emission type in which an image is implemented in a direction opposite to the display substrate 301, the display substrate 301 is not required to be formed of a transparent material. In this case, the display substrate 301 may be formed of metal.

In the case of forming the display substrate 301 using metal, the display substrate 301 may be formed of at least one metal selected from among the group consisting of iron, chromium, manganese, nickel, titanium, molybdenum, stainless steel (SUS), Invar, Inconel, and Kovar, but is not limited thereto.

The display substrate 301 may include a buffer layer 311. The buffer layer 311 provides a flat surface and blocks foreign matter or moisture from penetrating therethrough. For example, the buffer layer 311 may be formed of an inorganic substance such as silicon oxide, silicon nitride, silicon oxynitride, aluminum oxide, aluminum nitride, titanium oxide, and titanium nitride, or an organic substance such as polyimide, polyester, and acrylic. Alternatively, the buffer layer 311 may be formed in a stacked manner with the exemplified substances.

A thin-film transistor (TFT) may include an active layer 310, a gate electrode 320, a source electrode 330a, and a drain electrode 330b.

Hereinafter, a case where a TFT is a top gate type in which the active layer 310, the gate electrode 320, the source electrode 330a, and the drain electrode 330b are sequentially formed will be described. However, the present embodiment is not limited thereto, and various types of TFTs such as a bottom gate TFT may be employed.

The active layer 310 may contain a semiconductor material, such as amorphous silicon and polycrystalline silicon. However, the present embodiment is not limited thereto, and the active layer 310 may contain various materials. As an alternative embodiment, the active layer 310 may contain an organic semiconductor material or the like.

As another alternative embodiment, the active layer 310 may contain an oxide semiconductor material. For example, the active layer 310 may contain an oxide of a metal element selected from Groups 12, 13, and 14 elements such as zinc (Zn), indium (In), gallium (Ga), tin (Sn), cadmium (Cd), and germanium (Ge), and a combination thereof.

A gate dielectric layer 313 is formed on the active layer 310. The gate dielectric layer 313 serves to isolate the active layer 310 and the gate electrode 320. The gate dielectric layer 313 may be formed into a multilayer or a single layer of a film made of an inorganic substance such as silicon oxide and/or silicon nitride.

The gate electrode 320 is provided on the gate dielectric layer 313. The gate electrode 320 may be connected to a gate line (not illustrated) applying an on/off signal to the TFT.

The gate electrode 320 may be made of a low-resistivity metal. In consideration of adhesion with an adjacent layer, surface flatness of layers to be stacked, and processability, the gate electrode 320 may be formed into a multilayer or a single layer, which is made of at least one metal selected from among the group consisting of aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), and copper (Cu).

An interlayer dielectric film 315 is provided on the gate electrode 320. The interlayer dielectric film 315 isolates the source electrode 330a and the drain electrode 330b, and the gate electrode 320. The interlayer dielectric film 315 may be formed into a multilayer or single layer of a film made of an inorganic substance. For example, the inorganic substance may be a metal oxide or a metal nitride. Specifically, the inorganic substance may include silicon dioxide ($SiO_2$), silicon nitrides (SiNx), silicon oxynitride (SiON), aluminum oxide ($Al_2O_3$), titanium dioxide ($TiO_2$), tantalum pentoxide ($Ta_2O_5$), hafnium dioxide ($HfO_2$), or zirconium dioxide ($ZrO_2$).

The source electrode 330a and the drain electrode 330b are provided on the interlayer dielectric film 315. The source electrode 330a and the drain electrode 330b may be formed into a multilayer or a single layer, which is made of at least one metal selected from among the group consisting of aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), and copper (Cu). The source electrode 330a and the drain electrode 330b are electrically connected to a source region and a drain region of the active layer 310, respectively.

A planarization layer 317 is provided on the TFT. The planarization layer 317 is configured to cover the TFT, thereby eliminating steps caused by the TFT and planarizing the top surface. The planarization layer 317 may be formed into a single layer or a multilayer of a film made of an organic substance. The organic substance may include a general-purpose polymer such as polymethyl methacrylate (PMMA) and polystyrene (PS); a polymer derivative having phenols; polyacrylates; polyimides, poly(aryl ethers); polyamides; fluoropolymers; poly-p-xylenes; and polyvinyl alcohols; and a combination thereof. In addition, the planarization layer 317 may be formed into a multi-stack including an inorganic insulating layer and an organic insulating layer.

A first electrode 510 is provided on the planarization layer 317. The first electrode 510 may be electrically connected to the TFT. Specifically, the first electrode 510 may be electrically connected to the drain electrode 330b through a contact hole formed in the planarization layer 317. The first electrode 510 may have various shapes. For example, the first electrode 510 may be patterned in an island layout. A bank layer 400 defining a pixel region may be disposed on the planarization layer 317. The bank layer 400 may include a recess where the micro LED 100 will be received. The bank layer 400 may include, for example, a first bank layer 410 defining the recess. A height of the first bank layer 410 may be determined by a height and viewing angle of the micro LED 100. A size (width) of the recess may be determined by resolution, pixel density, and the like, of a display device. In an embodiment, the height of the micro LED 100 may be greater than the height of the first bank layer 410. The recess may have a quadrangular cross section, but is not limited to this. The recess may have various cross section shapes, such as polygonal, rectangular, circular, conical, elliptical, and triangular.

The bank layer 400 may further include a second bank layer 420 on the first bank layer 410. The first bank layer 410 and the second bank layer 420 have a step difference, and a width of the second bank layer 420 may be smaller than the width of the first bank layer 410. A conductive layer 550 may be disposed on the second bank layer 420. The conductive layer 550 may be disposed in a direction parallel to a data line or a scan line, and may be electrically connected to a second electrode 530. However, the present invention is not limited thereto. The second bank layer 420 may be omitted, and the conductive layer 550 may be disposed on the first bank layer 410. Alternatively, the second bank layer 420 and the conductive layer 550 may be omitted, and the second electrode 530 may be formed over the entire display substrate 301 such that the second electrode 530 serves as a shared electrode with which pixels (P) share each other. The first bank layer 410 and the second bank layer 420 may include a material absorbing at least a part of light, a light reflective material, or a light scattering material. The first bank layer 410 and the second bank layer 420 may include an insulating material that is translucent or opaque to visible light (e.g., light in a wavelength range of 380 nm to 750 nm).

For example, the first bank layer 410 and the second bank layer 420 may be formed of a thermoplastic such as polycarbonate (PC), polyethylene terephthalate (PET), polyethersulfone, polyvinyl butyral, polyphenylene ether, polyamide, polyetherimide, polynorbornene, poly(methyl methacrylate) resin, and cyclic polyolefin resin, a thermosetting plastic such as epoxy resin, phenolic resin, urethane resin, acrylic resin, vinyl ester resin, polyimide resin, urea resin, and melamine resin, or an organic insulating substance such as polystyrene, polyacrylonitrile, and polycarbonate, but are not limited thereto.

As another example, the first bank layer 410 and the second bank layer 420 may be formed of an inorganic insulating substance such as inorganic oxide and inorganic nitride including $SiO_x$, $SiN_x$, $SiN_xO_y$, $AlO_x$, $TiO_x$, $TaO_x$, and $ZnO_x$, but are not limited thereto. In an embodiment, the first bank layer 410 and the second bank layer 420 may be formed of an opaque material such as a material of a black matrix. A material of the insulating black matrix may include a resin or a paste including organic resin, glass paste, and black pigment; metal particles such as nickel, aluminum, molybdenum, and alloys thereof; metal oxide particles (e.g., chromium oxide); metal nitride particles (e.g., chromium nitride), or the like. In an alternate embodiment, the first bank layer 410 and the second bank layer 420 may be a distributed Bragg reflector (DBR) having high reflectivity or a mirror reflector formed of metal.

The micro LED 100 is disposed in the recess. The micro LED 100 may be electrically connected to the first electrode 510 at the recess.

The micro LED 100 emits light having wavelengths of different colors such as red, green, blue, white, and the like. With the micro LED 100, it is possible to realize white light by using fluorescent materials or by combining colors. The micro LED 100 has a size of 1 μm to 100 μm. The micro LEDs 100 are picked up from the growth substrate 101 individually or collectively by a transfer head according to the embodiment of the present invention, transferred to the display substrate 301, and received in the recesses of the display substrate 301.

The micro LED 100 includes a p-n diode, the first contact electrode 106 disposed on one side of the p-n diode, and the second contact electrode 107 disposed on the opposite side of the first contact electrode 106. The first contact electrode 106 may be connected to the first electrode 510, and the second contact electrode 107 may be connected to the second electrode 530.

The first electrode 510 may include: a reflective layer formed of Ag, Mg, Al, Pt, Pd, Au, Ni, Nd, Ir, Cr, or a compound thereof; and a transparent or translucent electrode layer provided on the reflective layer. The transparent or translucent electrode layer may be formed of at least one selected from among the group consisting of indium tin oxide (ITO), indium zinc oxide (IZO), zinc oxide (ZnO), indium oxide ($In_2O_3$), indium gallium oxide (IGO), and aluminum zinc oxide (AZO).

A passivation layer 520 surrounds the micro LED 100 in the recess. The passivation layer 520 covers the recess and the first electrode 510 by filling a space between the bank layer 400 and the micro LED 100. The passivation layer 520 may be formed of an organic insulating substance. For example, the passivation layer 520 may be formed of acrylic, poly (methyl methacrylate) (PMMA), benzocyclobutene (BCB), polyimide, acrylate, epoxy, and polyester, but is not limited thereto.

The passivation layer 520 is formed to have a height not covering an upper portion of the micro LED 100, for example, a height not covering the second contact electrode 107, whereby the second contact electrode 107 is exposed. The second electrode 530 may be formed on the passivation layer 520 electrically connected to the exposed second contact electrode 107 of the micro LED 100.

The second electrode 530 may be disposed on the micro LED 100 and the passivation layer 520. The second electrode 530 may be formed of a transparent conductive material such as ITO, IZO, ZnO, and $In_2O_3$.

A Transfer Head 1000 for a Micro LED According to a First Embodiment of the Present Invention Hereinbelow, a transfer head 1000 for a micro LED according to a first embodiment of the present invention will be described with reference to FIGS. 3 and 4.

Figure 3:
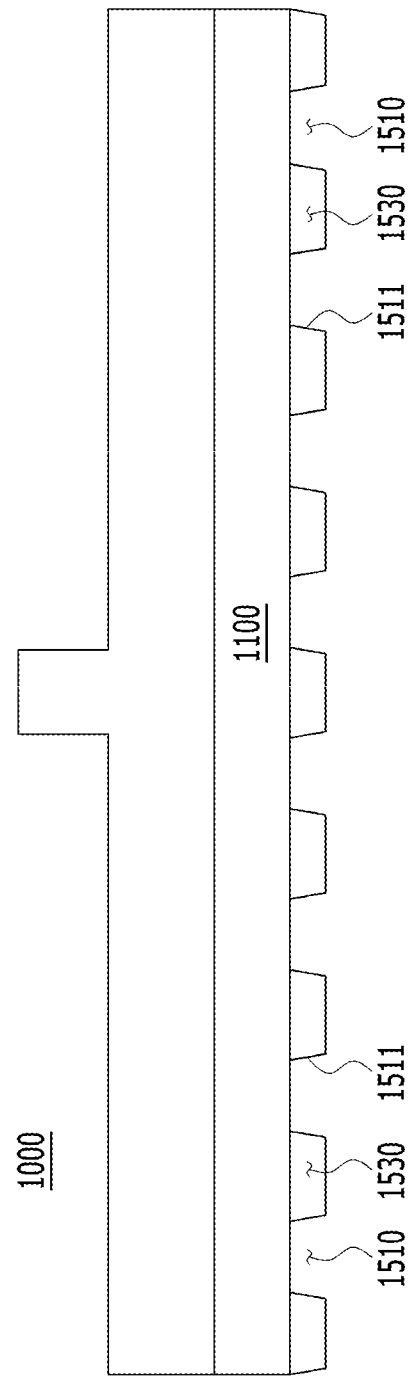
FIG. 3 is a view of a transfer head for a micro LED according to a first embodiment of the present invention.
Figure 4:
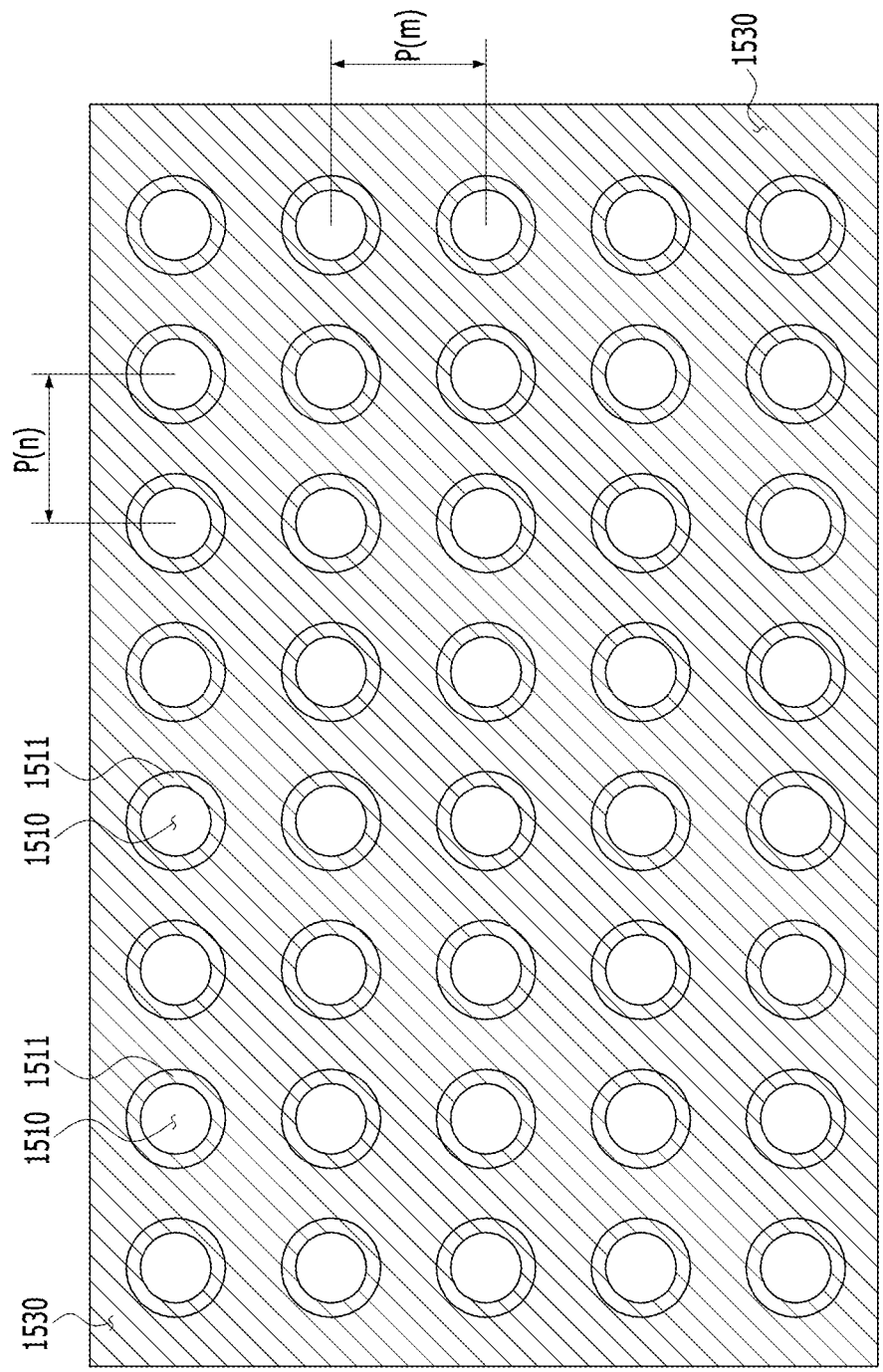
FIG. 4 is a bottom view of the transfer head for a micro LED illustrated in FIG. 3.

FIG. 3 is a view of a transfer head for a micro LED according to the first embodiment of the present invention; and FIG. 4 is a bottom view of the transfer head for a micro LED illustrated in FIG. 3.

As illustrated in FIGS. 3 and 4, the transfer head 1000 for a micro LED according to the first embodiment of the present invention includes: a grip portion 1100 provided at a lower portion of the transfer head 1000; and a recess portion 1510 provided on a lower surface of the grip portion 1100.

The transfer head 1000 for a micro LED is provided in a transfer system for a micro LED to be movable horizontally and vertically. Since the transfer head 1000 for a micro LED moves horizontally and vertically, it is possible to facilitate transfer of the micro LED 100 from the growth substrate 101 to the display substrate 301.

The grip portion 1100 is provided at the lower portion of the transfer head 1000 and indicates a portion where the transfer head 1000 for a micro LED grips the micro LED 100.

A grip force is applied to the grip portion 1100, and the grip force may be at least one of an electrostatic force, a magnetic force, and a suction force.

If the grip force of the grip portion 1100 is an electrostatic force, the grip portion 1100 may be made of a material which is easily charged. Therefore, the electrostatic force is generated by electrification of the grip portion 1100, and the micro LED 100 is inserted into the recess portion 1510 to be described later and gripped by the electrostatic force.

If the grip force of the grip portion 1100 is a magnetic force, a magnetic element may be provided in the grip portion 1100 or on an upper portion of the grip portion 1100. Therefore, the micro LED 100 is inserted into the recess portion 1510 to be described later and gripped by the magnetic force of the magnetic element.

If the grip force of the grip portion 1100 is a suction force, the grip portion 1100 may be configured with pores and a suction chamber for providing a suction force to the pores. Therefore, when gas is sucked through the suction chamber and the pores, the micro LED 100 is inserted into the recess portion 1510 to be described later and gripped by the suction force. In this case, the suction force may be vacuum suction force.

The recess portion 1510 is provided on the lower surface of the transfer head 1000, that is, on the lower surface of the grip portion 1100. When the transfer head 1000 picks up the micro LED 100, the recess portion 1510 provides a space where the micro LED 100 is inserted.

The recess portion 1510 has a shape recessed in the lower surface of the transfer head 1000, that is, in the lower surface of the grip portion 1100.

In the case of the present invention, since the micro LED 100 has a circular cross-section, the recess portion 1510 is also formed in a circular shape as illustrated in FIG. 4. However, the shape of the recess portion 1510 may vary depending on the cross-sectional shape of the micro LED 100. For example, when the micro LED 100 has a quadrangular cross-section, the recess portion 1510 may have a quadrangular cross-section corresponding to the cross-sectional shape of the micro LED 100.

The recess portion 1510 may be formed by etching the lower surface of the transfer head 1000, that is, the lower surface of the grip portion 1100, or by forming a mesa portion 1530 on the lower surface of the transfer head 1000.

When the micro LED 100 is gripped and inserted into the recess portion 1510, an upper surface of the micro LED 100 is brought into contact with a lower surface of an area where the recess portion 1510 is provided on the lower surface of the grip portion 1100. Therefore, of the lower surface of the grip portion 1100, the lower surface of the area where the recess portion is provided becomes a grip surface.

The recess portion 1510 has an inclined portion 1511 inclined outwardly from the upper portion to the lower portion of the transfer head 1000.

The inclined portion 1511 is provided as described above such that a cross-sectional area of the recess portion 1510 (in this case, the cross-sectional area means an area on a horizontal plane parallel to the lower surface of the transfer head 1000) increases from the upper portion to the lower portion of the transfer head 1000. In other words, the cross-sectional area of the recess portion 1510 becomes small from the lower portion to the upper portion of the transfer head 1000 due to the inclined portion 1511.

In this case, it is preferable that the uppermost cross-sectional area of the recess portion 1510 is configured to be larger than the cross-sectional area of the upper surface of the micro LED 100. This is to allow the upper surface of the micro LED 100 to easily come into contact with the uppermost surface of the recess portion 1510 (i.e., the lower surface of the grip portion 1100 or the grip surface) when the micro LED 100 is picked up by the grip force and inserted into the recess portion 1510.

In addition, it is preferable that the lowermost cross-sectional area of the recess portion 1510 is configured to be larger than the largest cross-sectional area of the micro LED 100. This is to prevent the micro LED 100 from not being inserted into the recess portion 1510 when the micro LED 100 is picked up by the grip force in the case that the largest cross-sectional area of the recess portion 1510 is configured to be smaller than the largest cross-sectional area of the micro LED 100.

The mesa portion 1530 may be formed on the lower surface of the transfer head 1000 due to the recess portion 1510 formed on the lower surface of the transfer head 1000.

The mesa portion 1530 refers to a lower surface of the transfer head 1000, that is, an area where the recess portion 1510 is not formed in the lower surface of the grip portion 1100. Therefore, a lower surface of the mesa portion 1530 may be regarded as the lowermost surface of the transfer head 1000. The mesa portion 1530 has a shape protruding downward from the transfer head 1000 compared with the recess portion 1510.

As described above, since the transfer head 1000 has the recess portion 1510 and the mesa portion 1530, the transfer head 1000 has a grip area and a non-grip area on the lower surface thereof. In other words, the recess portion 1510, which is a region where the transfer head 1000 grips the micro LED 100, is the grip area, and the mesa portion 1530, which is a region where the micro LED 100 is not gripped, is a non-grip area.

As illustrated in FIG. 4, multiple recess portions 1510 may be provided in the lower surface of the transfer head 1000, that is, in the lower surface of the grip portion 1100. In this case, the multiple recess portions 1510 may be arranged to have a matrix form having multiple rows and multiple columns.

As described above, since the multiple recess portions 1510 are arranged in a matrix form, the transfer head 1000 transfers and mounts the micro LED 100 on the display substrate 301 easily.

As illustrated in FIG. 4, in the case where a pitch distance of the micro LEDs 100 on the growth substrate 101 is P(n) in a column direction and a pitch distance of the micro LEDs 100 on the growth substrate 101 in a row direction is P(m), the multiple recess portions 1510 may be provided with pitch distances equal to the pitch distances of the micro LEDs 100.

In other words, when the pitch distances of the micro LEDs 100 on the growth substrate 101 are P(n) in the column direction and P(m) in the row direction, pitch distances of the multiple recess portions 1510 (i.e., the grip area) of the transfer head 1000 are P(n) in a column direction and P(m) in a row direction.

According to the above configuration, the transfer head 1000 vacuum-sucks all of the micro LEDs 100 on the growth substrate 101 at the same time.

Hereinafter, a process for a transfer method using the transfer head 1000 for a micro LED according to the first embodiment of the present invention will be described with reference to FIGS. 5A to 5D.

FIGS. 5A to 5D are views illustrating a method of transferring micro LEDs using the transfer head for a micro LED illustrated in FIG. 3.

Figure 5A:
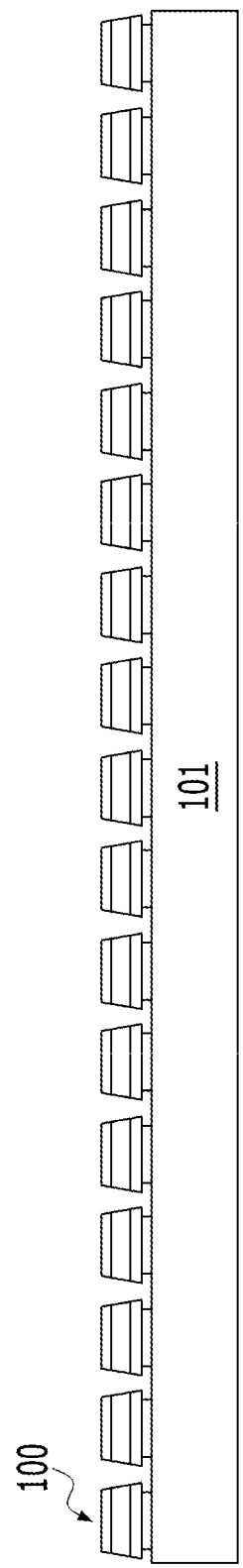

Referring to FIG. 5A, the micro LEDs 100 formed on the growth substrate 101 are prepared to be separable from the growth substrate 101.

Next, referring to FIG. 5B, in order to pick up the micro LEDs 100 formed on the growth substrate 101, the transfer head 1000 is moved above the growth substrate 101.

Figure 5C:
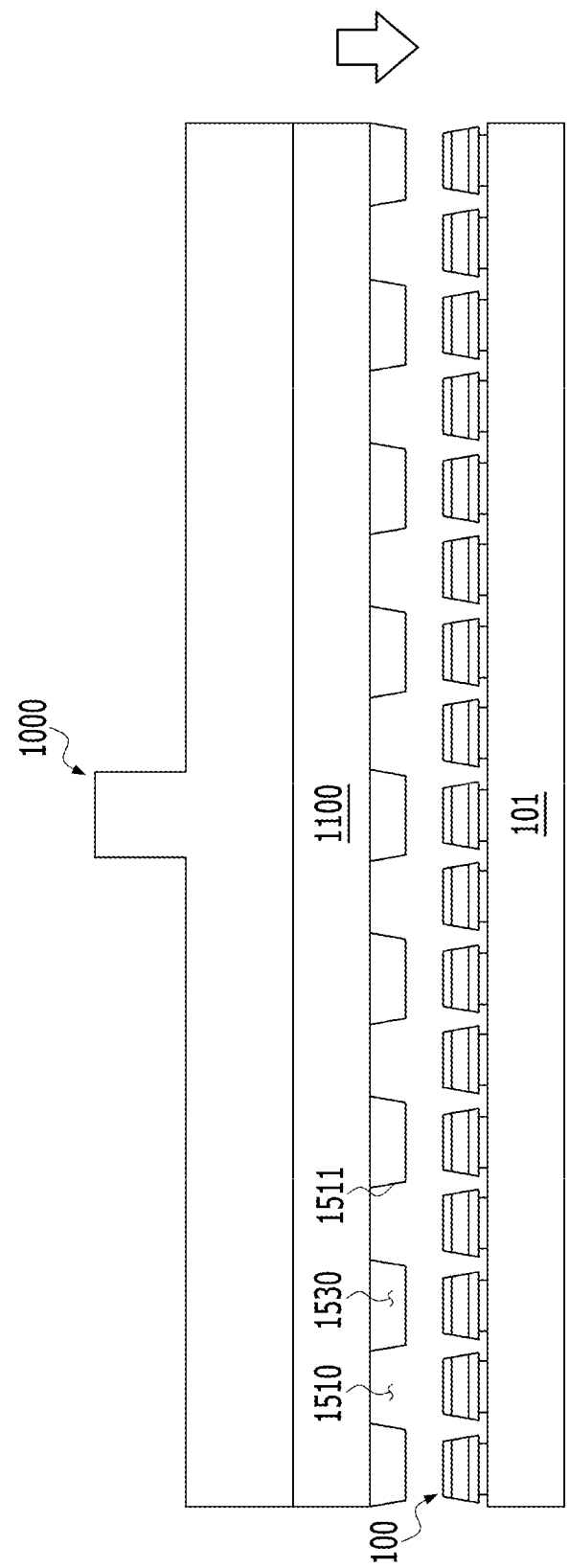

Then, as illustrated in FIG. 5C, the transfer head 1000 is lowered toward the growth substrate 101. In this case, a controller controls lowering of the transfer head 1000 such that a lower surface of the transfer head 1000, that is, a lower surface of the mesa portion 1530 is spaced apart from upper surfaces of the micro LEDs 100. In other words, when the transfer head 1000 picks up the micro LED 100, the controller controls transfer head 1000 such that the lower surface of the transfer head 1000 is spaced apart from the upper surfaces of the micro LEDs 100.

When the lower surface of the transfer head 1000 and the upper surface of the micro LED 100 are spaced apart from each other by a predetermined distance and then the transfer head 1000 is lowered toward the growth substrate 101, a grip force is generated from the grip portion 1100. In this case, as described above, when the grip force is an electrostatic force, the grip portion is charged such that an electrostatic force is generated. When the grip force is a magnetic force, a magnetic force is generated by the magnetic element. When the grip force is a suction force, gas is sucked through the pores and the suction chamber such that the suction force is generated.

Figure 5D:
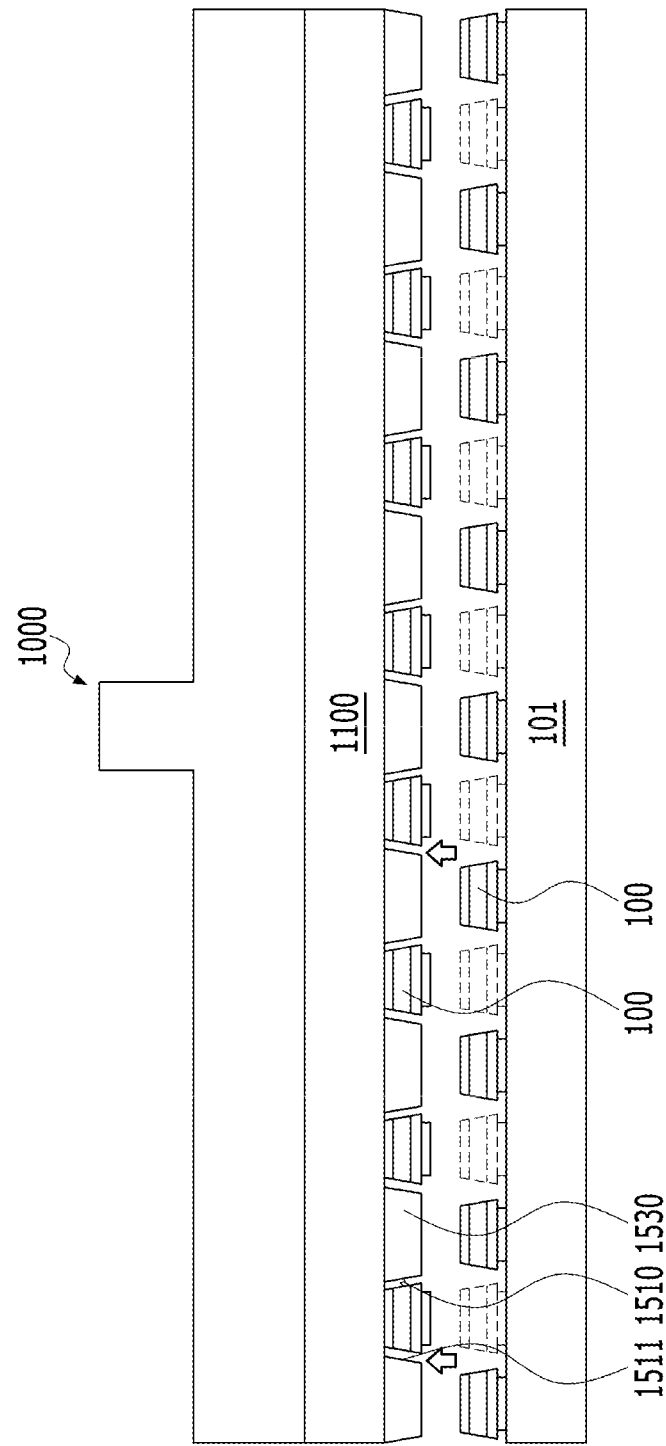

As illustrated in FIG. 5D, when the grip force is generated from the grip portion 1100, the micro LEDs 100 are picked up by the recess portion 1510 and inserted into the recess portion 1510 by the grip force. This is because even though the upper surfaces of the micro LEDs 100 and the lower surface of the transfer head 1000 are spaced apart from each other by a predetermined distance by control, the grip force of the grip portion 1100 causes the micro LEDs 100 to move toward the recess portion 1510.

As the grip force is generated from the grip portion 1100 as described above, the transfer head 1000 is controlled such that the lower surface of the transfer head 1000, that is, the lower surface of the mesa portion 1530, is spaced apart from the upper surfaces of the micro LEDs 100 by a predetermined distance, and the transfer head 1000 picks up the micro LEDs 100.

When the micro LEDs 100 are sucked by the grip force and picked up, one micro LED 100 is inserted into one recess portion 1510. As a result, each micro LED 100 is sucked at a correct position and picked up.

When the micro LED 100 is picked up and inserted into the recess portion 1510, the transfer head 1000 is lifted and moved while maintaining the grip force of the grip portion 1100.

Thereafter, the transfer head 1000 is moved above the display substrate 301, and then the transfer head 1000 is lowered. In this case, the micro LEDs 100 are transferred to the display substrate 301 by releasing the grip force through the grip portion 1100.

According to the above process sequence, the transfer head 1000 can transfer the micro LEDs 100 formed on the growth substrate 101 to the display substrate 301 and mount the micro LEDs 100.

The transfer head 1000 for a micro LED according to the first embodiment of the present invention having the above-described configuration has the following effects.

With respect to picking up of the micro LEDs 100 by the transfer head 1000, the grip portion 1100 grips the micro LEDs 100 while the lower surface of the transfer head 1000 is spaced apart from the upper surfaces of the micro LEDs 100 by a predetermined distance. Accordingly, unlike the conventional technique, gripping of the micro LEDs 100 is achieved in a non-contact manner. Therefore, it is possible to prevent the distortion which may occur by the contact between a lower surface of the conventional transfer head 1000 and the upper surfaces of the micro LEDs 100, and prevent the positional error which may occur when transferring the micro LEDs 100 to the display substrate 301. In addition, since the lower surface of the transfer head 1000 is not brought into contact with the upper surfaces of the micro LEDs 100, it is possible to prevent the micro LEDs 100 from being damaged by the lower surface of the transfer head 1000.

The recess portion 1510 is configured with the inclined portion 1511 such that the inclined portion 1511 guides the micro LEDs 100 when the micro LEDs 100 are picked up from the growth substrate 101 and inserted into the recess portions 1510. As a result, each micro LED 100 is sucked at a correct position and picked up. Therefore, it is possible to prevent the positional error that may occur during gripping of the micro LED 100, whereby the micro LEDs 100 can be transferred to the display substrate 301 at the correct position.

Figure 6:
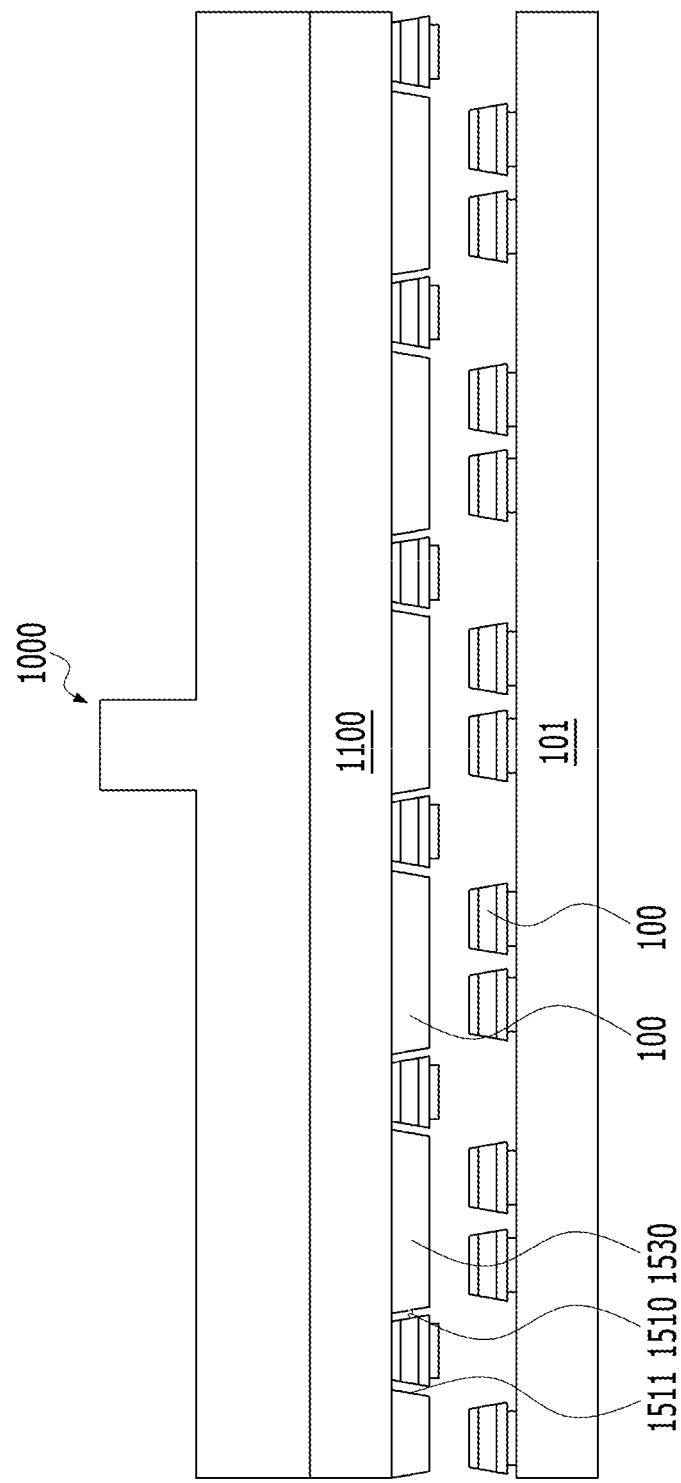
FIG. 6 is a view illustrating a modification of the transfer head for a micro LED according to the first embodiment of the present invention.

The transfer head 1000 for a micro LED according to the first embodiment may have a modification as illustrated in FIG. 6.

FIG. 6 is a view illustrating a modification of the transfer head for a micro LED according to the first embodiment of the present invention.

As illustrated in FIG. 6, a recess portion 1510 of a transfer head 1000 may be formed only at a position corresponding to the micro LEDs 100 to be gripped. In this case, the micro LEDs 100 to be gripped in FIG. 6 are the micro LEDs 100 at 2nd, 5th, 8th, 11th, 14th, and 17th positions with reference to the left side of the drawing.

According to the above configuration, only the micro LED 100 at the (3n-1)th row (in this case, n is an integer) is sucked and transferred. In other words, when pitch intervals of the micro LEDs 100 on the growth substrate 101 are P(n) in the column direction and P(m) in the row direction, pitch distances of the recess portion 1510 of the transfer head 1000 are 3p(n) in a column direction and p(m) in a row direction.

Here, 3p(n) means 3 times the column pitch distance p(n).

Here, each of the micro LEDs 100 transferred in the (3n-1)th column may be any one of red, green, blue, and white LEDs. With such a configuration, it is possible to transfer the micro LEDs 100 of the same luminous color mounted on the display substrate 301 with intervals of 3p(n).

A Transfer Head 1000' for a Micro LED According to a Second Embodiment of the Present Invention Hereinbelow, a transfer head 1000' for a micro LED according to a second embodiment of the present invention will be described with reference to FIG. 7. It should be noted that the embodiment described below will be described with particular emphasis on characteristic components as compared with the first embodiment, and descriptions of the same or similar components as those of the first embodiment will be omitted.

Figure 7:
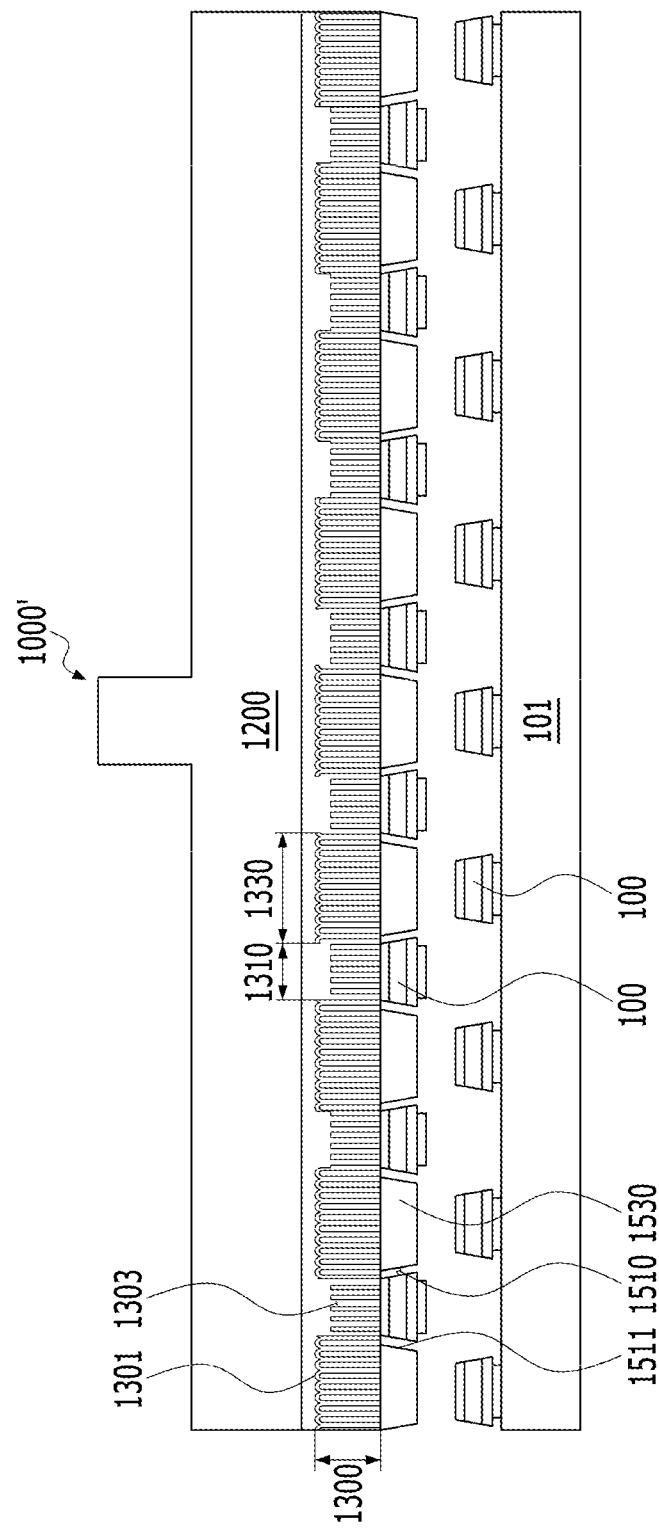
FIG. 7 is a view of a transfer head for a micro LED according to a second embodiment of the present invention.

FIG. 7 is a view illustrating a transfer head for a micro LED according to the second embodiment of the present invention grips the micro LEDs.

As illustrated in FIG. 7, the transfer head 1000' for a micro LED according to the second embodiment of the present invention is provided with a suction chamber 1200 on an upper portion of a grip portion 1100 described in the first embodiment, and the grip portion 1100 is embodied as a porous member. In other words, the transfer head 1000' for a micro LED according to the second embodiment of the present invention is provided with the suction chamber 1200 and the porous member. A recess portion 1510 is formed on a lower surface of the porous member.

The transfer head 1000' for a micro LED according to the second embodiment of the present invention is characterized in that the porous member is an anodic oxide film 1300 having pores 1303 formed by anodizing metal.

The recess portion 1510 is formed on the lower surface of the anodic oxide film 1300 and communicates with the pores 1303 of the anodic oxide film 1300 and the suction chamber 1200.

The suction chamber 1200 is connected to a suction port supplying a suction force or releasing a suction force. The suction chamber 1200 functions to apply a suction force to the multiple pores 1303 of the anodic oxide film 1300 or to release a suction force applied to the pores according to the operation of the suction port. A structure of engaging the suction chamber 1200 to the anodic oxide film 1300 is not limited as long as the structure is suitable for preventing gas or air from leaking to other parts when applying the suction force to the anodic oxide film 1300 or releasing the applied suction force.

When a suction force is generated in the suction chamber 1200, the transfer head 1000' according to the second embodiment of the present invention sucks gas or air through the pores of the anodic oxide film 1300 such that micro LEDs 100 are gripped by the recess portion 1510.

The gripping of the micro LEDs 100 by the above-described suction chamber 1200 may be realized by vacuum-suction. Therefore, in the following description, the description will be based on the transfer head 1000' for a micro LED gripping the micro LEDs 100 by vacuum-suction.

The anodic oxide film 1300 is a film formed by anodizing a metal that is a base material, and the pores 1303 are pores formed in a process of forming the anodic oxide film 1300 by anodizing the metal.

For example, in a case that the base metal is aluminum (Al) or an aluminum alloy, the anodization of the base material forms the anodic oxide film 1300 consisting of anodized aluminum ($Al_2O_3$) on a surface of the base material.

As described above, the anodic oxide film 1300 is divided into a barrier layer 1301 in which pores 1303 are not formed and a porous layer in which the pores 1303 are formed inside.

The barrier layer 1301 is positioned on top of the base material and the porous layer is positioned on top of the barrier layer 1301.

After removing the base material on which the anodic oxide film 1300 having the barrier layer 1301 and the porous layer is formed, only anodic oxide film 1300 consisting of anodized aluminum ($Al_2O_3$) remains.

The anodic oxide film 1300 has the pores 1303 configured vertically and having a regular arrangement with a uniform diameter.

Accordingly, after removing the barrier layer 1301, the pores 1303 have a structure extending from top to bottom vertically, thereby facilitating the generation of the vacuum pressure in the vertical direction.

The inside of the anodic oxide film 1300 forms an air flow path vertically by the vertical pores 1303.

An internal width of the pores 1303 has a size of several nanometers to several hundred nanometers. For example, when a size of the micro LED to be vacuum-sucked is 30 μm×30 μm and an internal width of the pores 1303 is several nanometers, it is possible to vacuum-suck the micro LEDs 100 by approximately tens of millions of pores 1303. When a size of the micro LED to be vacuum-sucked is 30 μm×30 μm and an internal width of the pores 1303 is several hundred nanometers, it is possible to vacuum-suck the micro LEDs 100 by approximately tens of thousands of pores 1303.

The micro LED 100 is lightweight because the micro LED 100 is fundamentally configured with the first semiconductor layer 102, the second semiconductor layer 104, the active layer 103 provided between the first semiconductor layer 102 and the second semiconductor layer 104, the first contact electrode 106, and the second contact electrode 107. Accordingly, it is possible to grip the micro LEDs 100 by tens of thousands to tens of millions of pores 1303 formed in the anodic oxide film 1300 by vacuum-suction.

The suction chamber 1200 is provided on the anodic oxide film 1300. The suction chamber 1200 is connected to a vacuum port providing vacuum pressure. The suction chamber 1200 functions to vacuum the multiple vertical pores of the anodic oxide film 1300 or release the vacuum according to the operation of the vacuum port.

When gripping the micro LEDs 100, the vacuum applied to the suction chamber 1200 is transferred to the multiple pores 1303 of the anodic oxide film 1300 to provide a vacuum suction force for the micro LEDs 100. When detaching the micro LEDs 100, the vacuum applied to the suction chamber 1200 is released to remove the vacuum from the multiple pores 1303 of the anodic oxide film 1300 whereby the vacuum suction force to the micro LEDs 100 is removed.

The anodic oxide film 1300 includes a suction region 1310 gripping the micro LEDs 100 by vacuum-suction and a non-suction region 1330 not gripping the micro LEDs 100. The suction region 1310 is a region where vacuum of the suction chamber 1200 is transferred and grips the micro LEDs 100 by vacuum-suction. The non-suction region 1330 is a region where vacuum of the suction chamber 1200 is not transferred and thus does not grip the micro LEDs 100.

Preferably, the suction region 1310 is a region where the pores 1303 extend from top to bottom vertically, and the non-suction region 1330 is a region where at least any one of upper and lower portions of the pores 1303 is closed.

In addition, the suction region 1310 is a region corresponding to the position where the recess portion 1510 is formed such that the pores 1303 communicate with the recess portion 1510. The non-suction region 1330 is a region corresponding to the position where the mesa portion 1530 is formed such that the pores 1303 do not communicate with the outside.

The non-suction region 1330 may be embodied by forming a shielding portion on at least a part of a surface of the anodic oxide film 1300. The shielding portion is formed to close openings of the pores 1303 exposed to at least a part of the surface of the anodic oxide film 1300. The shielding portion may be formed on at least a part of upper and lower surfaces of the anodic oxide film 1300. The shielding portion is not limited in material, shape, and thickness as long as the shielding portion functions to close the openings of the pores 1303 exposed to the surface of the porous member 1100. Preferably, the shielding portion may be further provided and formed of a photoresist (PR, including dry film PR) or a metal, and the barrier layer 1301 may be the shielding portion.

The non-suction region 1330 may be formed such that the barrier layer 1301 formed in the fabrication of the anodic oxide film 1300 closes any one of the upper and lower portions of the vertical pores 1303. The suction region 1310 may be formed such that the barrier layer 1301 is removed by etching or the like so that the upper and lower portions of the vertical pores 1303 extend from top to bottom.

In addition, a thickness of the anodic oxide film 1300 in the suction region 1310 is smaller than a thickness of the anodic oxide film 1300 in the non-suction region 1330 because the pores 1303 extending from top to bottom are formed by removing a part of the barrier layer 1301.

FIG. 7 illustrates that the barrier layer 1301 is provided at an upper portion of the anodic oxide film 1300 and the porous layer having the pores 1303 is provided at a lower portion thereof. However, the anodic oxide film 1300 illustrated in FIG. 7 may be inverted to form the non-suction region 1330 such that the barrier layer 1301 is provided at the lower portion of the anodic oxide film 1300.

It has been described the non-suction region 1330 that any one of the upper and lower portions of the pores 1303 is closed by the barrier layer 1301. However, the opposite surface, which is not closed by the barrier layer 1301, may be configured such that an additional coating layer is provided to close both the upper and lower portions. In forming the non-suction region 1330, the configuration in which both the upper and lower surfaces of the anodic oxide film 1300 are closed is advantageous in that it is possible to reduce the possibility that foreign substances remain in the pores 1303 of the non-suction region 1330 compared with the configuration in which one of the upper and lower surfaces of the anodic oxide film 1300 is closed.

The transfer head 1000' according to the second embodiment of the present invention having the above-described configuration is configured with the pores 1303 uniformly formed when forming the anodic oxide film 1300, whereby a suction force or a vacuum is uniformly transferred. Accordingly, it is possible to easily grip the micro LED 100 having a very small size.

Figure 8:
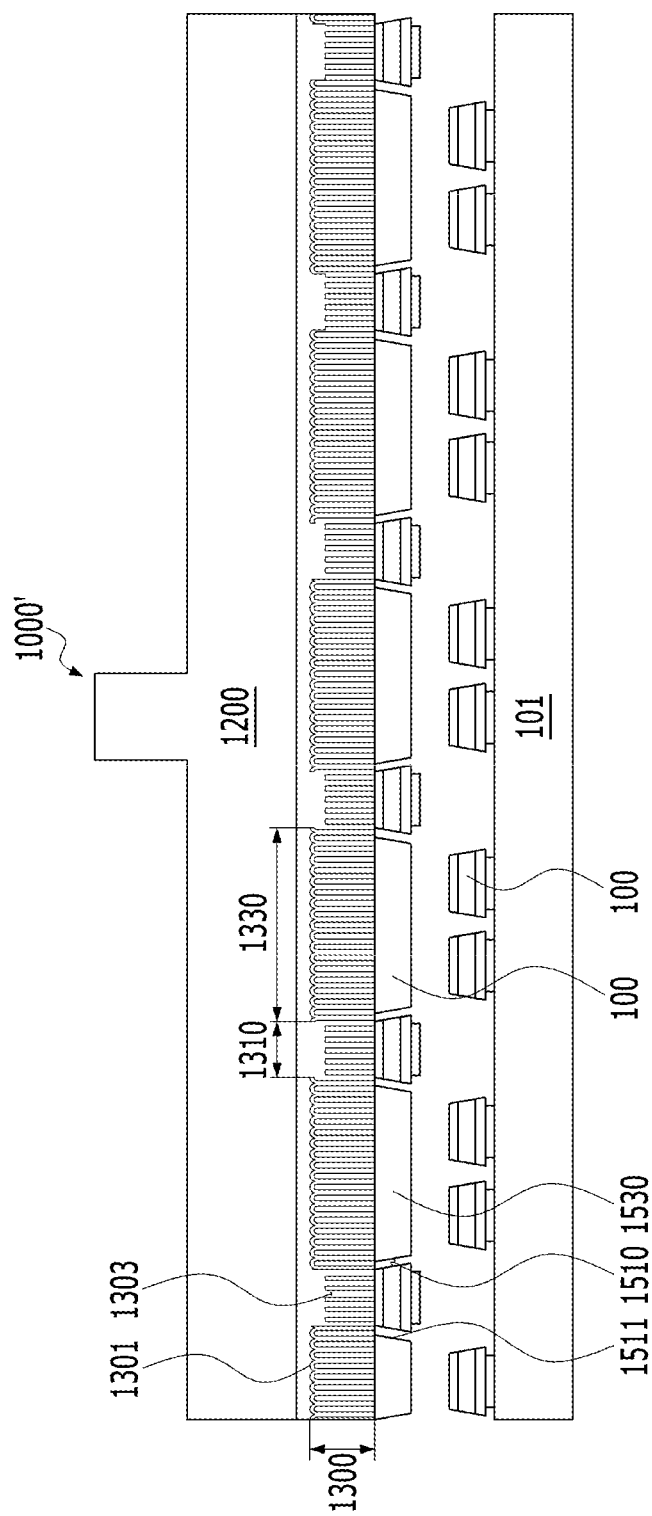
FIG. 8 is a view illustrating a modification of the transfer head for a micro LED according to the second embodiment of the present invention.

The transfer head 1000' for a micro LED according to the second embodiment may have a modification as illustrated in FIG. 8.

FIG. 8 is a view illustrating a modification of the transfer head for a micro LED according to the second embodiment of the present invention.

As illustrated in FIG. 8, a recess portion 1510 of a transfer head 1000' may be formed only at a position corresponding to the micro LEDs 100 to be gripped. In this case, the micro LEDs 100 to be gripped in FIG. 8 are the micro LEDs 100 at 2nd, 5th, 8th, 11th, 14th, and 17th positions with reference to the left side of the drawing.

According to the above configuration, only the micro LED 100 at the (3n-1)th row (in this case, n is an integer) is sucked and transferred. In other words, when pitch distances of the micro LEDs 100 on the growth substrate 101 are P(n) in the column direction and P(m) in the row direction, pitch distances of the recess portion 1510 of the transfer head 1000 are 3p(n) in a column direction and p(m) in a row direction.

Here, 3p(n) means 3 times the column pitch distance p(n).

Here, each of the micro LEDs 100 transferred in the (3n-1)th column may be any one of red, green, blue, and white LEDs. With such a configuration, it is possible to transfer the micro LEDs 100 of the same luminous color mounted on the display substrate 301 with intervals of 3p(n).

As described above, the present invention has been described with reference to the preferred embodiments. However, those skilled in the art will appreciate that various modifications, additions and substitutions are possible, without departing from the scope and spirit of the invention as disclosed in the accompanying claims.

What is claimed is:

1. A transfer head for a micro LED, the transfer head comprising:
a grip portion; and
a recess portion provided on a lower surface of the grip portion,
wherein a plurality of micro LEDs are picked up by the recess portion,
wherein the grip portion is an anodic oxide film that includes a barrier layer in which pores are not formed and a porous layer in which pores are formed,
wherein the anodic oxide film includes a suction region gripping the micro LEDs by vacuum-suction and a non-suction region not gripping the micro LEDs,
wherein the suction region is formed by removing the barrier layer so that pores extend from top to bottom vertically in the suction region,
wherein the non-suction region is formed such that the barrier layer closes any one of upper and lower portions of pores in the non-suction region,
wherein the suction region is a region corresponding to a position where the recess portion is formed, the pores in the suction region communicating with the recess portion, and
wherein the micro LEDs contact the lower surface of the grip portion.

2. The transfer head of claim 1, wherein the transfer head is controlled such that a lower surface of the transfer head is spaced apart from the micro LEDs when the transfer head picks up the micro LEDs.

3. The transfer head of claim 1, wherein the recess portion has an inclined portion.

4. The transfer head of claim 1, wherein a lower surface of an area where the recess portion picks up a micro LED among the micro LEDs and is provided on the lower surface of the grip portion is configured to be larger than an upper surface of the micro LED.

* * * * *